(12) United States Patent
Kim et al.

(10) Patent No.: US 7,449,403 B2
(45) Date of Patent: Nov. 11, 2008

(54) METHOD FOR MANUFACTURING SEMICONDUCTOR DEVICE

(75) Inventors: Dong Seok Kim, Seoul (KR); Bong Soo Kim, Seoul (KR)

(73) Assignee: Hynix Semiconductor Inc., Kyoungki-do (KR)

(*) Notice: Subject to any disclaimer, the term of this patent is extended or adjusted under 35 U.S.C. 154(b) by 390 days.

(21) Appl. No.: 11/122,718

(22) Filed: May 5, 2005

(65) Prior Publication Data

US 2005/0272193 A1 Dec. 8, 2005

(30) Foreign Application Priority Data

Aug. 6, 2004 (KR) .................. 10-2004-0061933

(51) Int. Cl.
*H01L 21/3205* (2006.01)
(52) U.S. Cl. ................ 438/592; 438/595; 257/E21.626
(58) Field of Classification Search .............. 438/305, 438/592, 595, 657; 257/E21.626, E21.64
See application file for complete search history.

(56) References Cited

U.S. PATENT DOCUMENTS 5,102,815 A * 4/1992 Sanchez ................. 438/305
6,723,623 B1 * 4/2004 Nguyen .................. 438/525

FOREIGN PATENT DOCUMENTS

| KR | 19940016961 | 7/1994 |
| KR | 1019960000233 | 1/1996 |
| KR | 10-1998-0060621 | 10/1998 |
| KR | 1020020096393 | 12/2002 |
| KR | 1020030044340 | 6/2003 |

OTHER PUBLICATIONS

Quirk et al., "Semiconductor Manufacturing Technology", 2001, pp. 273-275.*
Korean Patent Gazette from Korean Patent Office, publication date: Aug. 9, 2006.

* cited by examiner

Primary Examiner—Chandra Chaudhari
(74) Attorney, Agent, or Firm—Ladas & Parry LLP

(57) ABSTRACT

Disclosed is a method for manufacturing a semiconductor device. According to such a method, in forming a MOSFET to which a double spacer structure is applied, a first spacer of an oxide film is formed after only an upper gate conductive layer is primarily patterned, and then a second spacer of a nitride film is formed after a lower gate conductive layer is etched, so that impurities cannot be diffused up to into the semiconductor substrate through PLDs existing within the oxide film because the first spacer of the oxide film does not come in contact with a semiconductor substrate. Consequently, the gate hump phenomenon is prevented, as a result of which process yield and operation reliability of the device can be improved.

4 Claims, 4 Drawing Sheets

METHOD FOR MANUFACTURING SEMICONDUCTOR DEVICE

BACKGROUND OF THE INVENTION

1. Field of the Invention

The present invention relates generally to a method for manufacturing a semiconductor device, and more particularly to a method for manufacturing a semiconductor device, which can prevent impurities from entering into a substrate through Peroxy Linkage Defects (hereinafter referred to as 'PLD') existing within an oxide film when an oxide/nitride film double spacer is applied to the manufacture of a transistor.

2. Description of the Prior Art

As a semiconductor device becomes highly integrated, design rules for a gate electrode or a source/drain region and contacts therewith of a Metal Oxide Semiconductor Field Effect Transistor (hereinafter referred to as 'MOSFET') are orienting toward size reduction over the whole processes in order to diminish a size of the device. However, since a width of the gate electrode is proportional to electric resistance, reducing the width by a factor of N brings about increase of the electric resistance by N times, which results in a problem of a loss in operating speed of the semiconductor device.

Thereupon, taking advantage of characteristics of a polysilicon layer/oxide film interface which exhibits the most stable MOSFET characteristics, polycide having a laminated structure of a polysilicon layer and a silicide film may be used as a low-resistance gate for reducing resistance of the gate electrode.

Also, a pn junction is formed by ion-implanting n- or p-type impurities into a p- or n-type substrate and then performing heat treatment to activate the impurities and form a diffusion region. However, in a case of a semiconductor device with a reduced channel width, a short channel effect may arise due to lateral diffusion from the diffusion region. Thus, there are employed various methods for preventing this effect, including a method in which the junction with a shallow depth is formed, a source/drain region is formed in a Lightly Doped Drain (hereinafter referred to as 'LDD') structure having a lowly-concentrated impurity region so as to prevent junction failure due to field concentration on a drain and prevent threshold voltage fluctuation effected by thermal charges, and halo ion implantation is performed by an inclined ion implantation technique.

FIG. 1 is a sectional view of a semiconductor device according to the prior art, which shows an example of a double gate electrode and a double spacer.

First of all, a gate oxide film 12 is formed on a semiconductor substrate 10 and then a first gate conductive layer 14, a second gate conductive layer 16 and a hard mask layer 18 are successively deposited on the gate oxide film 10. Thereafter, the layers 14, 16, 18 are patterned using a gate mask to form a gate electrode consisting of first and second gate conductive layer patterns 14, 16 and a hard mask layer pattern 18 laminated thereon.

Next, a spacer oxide film and a spacer nitride film are successively coated over the entire surface of the resultant structure and are etched back to form a first and a second spacer 20, 22 on sidewalls of the first and second gate conductive layer patterns 14, 16 and the hard mask layer pattern 18. Here, the reason why the spacer is formed in a double structure is that, when the spacer is formed of only the nitride film, stresses are incurred in the silicon substrate and so characteristics of the device are deteriorated.

In the above-mentioned method for manufacturing a semiconductor device, the double spacer consisting of the oxide and nitride films may prevent the nitride film from incurring stresses in the semiconductor substrate because the oxide film comes in contact with the substrate. However, impurities such as hydrogen, etc. coming from an insulating interlayer over the gate electrode enter the oxide film through PLDs existing therein and may be diffused up to into the semiconductor substrate, which causes a gate hump phenomenon where the diffused impurities deactivates n- or p-type impurities doped in a channel region and thus a threshold voltage (Vt) of the device varies. This tendency becoming more deepened with the downsizing of the device raises a problem of lowering in process yield and operating characteristics of the device.

SUMMARY OF THE INVENTION

Accordingly, the present invention has been made to solve the above-mentioned problems occurring in the prior art, and an object of the present invention is to provide a method for manufacturing a semiconductor device, which can prevent impurities from entering into a substrate through PLDs existing within an oxide film of an oxide/nitride film double spacer applied to the manufacture of the semiconductor, thus avoiding lowering in operating characteristics of the device due to the entering of the impurities.

In order to accomplish this object, there is provided a method for manufacturing a semiconductor device in accordance with one aspect of the present invention, the method comprising the steps of: forming a gate oxide film on a semiconductor substrate; successively depositing a first gate conductive layer, a second gate conductive layer and a hard mask layer on the gate oxide film; etching the second gate conductive layer and the hard mask layer over the whole thicknesses thereof and etching the first gate conductive layer over a partial thickness thereof to form first and second gate conducive layer patterns and a hard mask layer pattern; forming a first spacer of an oxide film on sidewalls of the first and second gate conductive layer patterns and the hard mask layer pattern; etching the first gate conductive layer over the remaining thickness thereof to form a gate electrode consisting of the first and second gate conductive layer patterns; and forming a second spacer of a nitride film on sidewalls of the first spacer and the first gate conductive layer pattern.

Here, in the primary etching of the first gate conductive layer, 20 to 80% of a thickness of the first gate conductive layer is etched, and the first spacer is formed of any one selected from the group consisting of a low pressure tetra ethyl ortho silicate (LPTEOS) or a high temperature oxide (HTO) provided by a low pressure chemical vapor deposition (LPCVD) process and an oxide film provided by an atomic layer deposition (ALD) process. The secondary etching of the first gate conductive layer is performed using an inclined etching technique. Also, LDD ion implantation is performed after the formation of the gate electrode and before the formation of the second spacer.

In accordance with another aspect of the present invention, there is provided a method for manufacturing a semiconductor device, the method comprising the steps of: forming a gate oxide film on a semiconductor substrate; successively depositing a first gate conductive layer, a second gate conductive layer and a hard mask layer on the gate oxide film; patterning the second gate conductive layer and the hard mask layer to form a second gate conducive layer pattern and a hard mask layer pattern; forming a first spacer of an oxide film on sidewalls of the second gate conductive layer pattern and the hard mask layer pattern; etching the first gate conductive layer to form a gate electrode consisting of the first and second gate conductive layer patterns; and forming a second spacer of a nitride film on sidewalls of the first spacer and the first gate conductive layer pattern.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
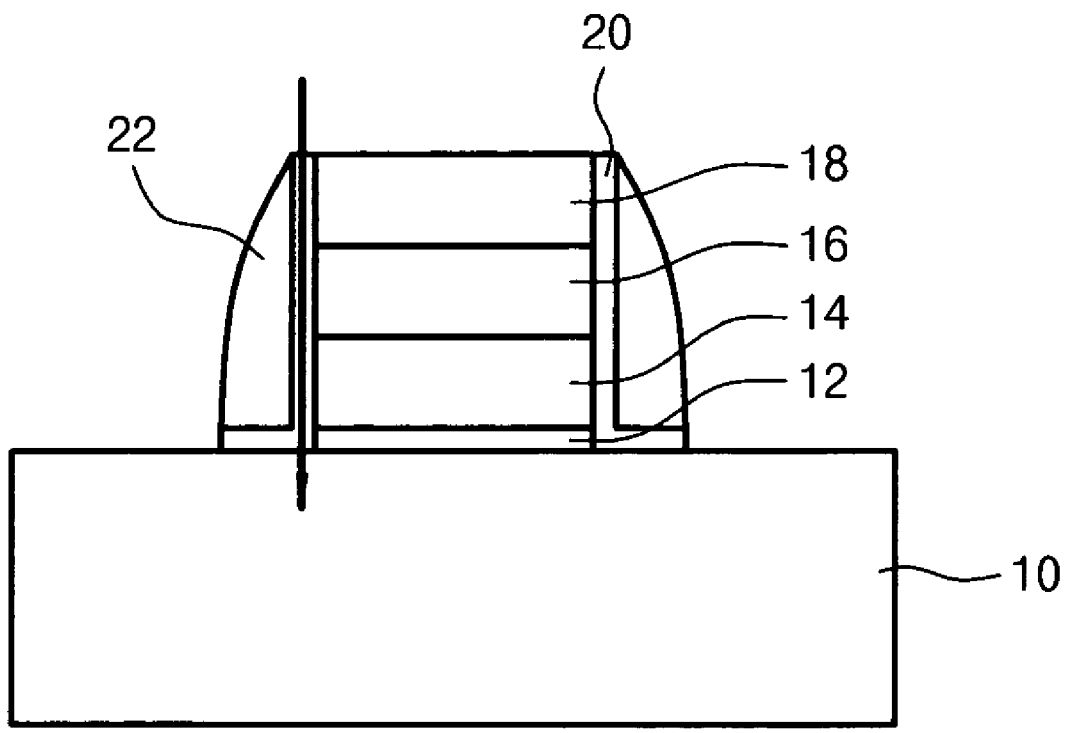
FIG. 1 is a sectional view of a semiconductor device according to the prior art.

Hereinafter, preferred embodiments of the present invention will be described with reference to the accompanying drawings. In the following description and drawings, the same reference numerals are used to designate the same or similar components, and so repetition of the description on the same or similar components will be omitted.

FIG. 2a to 2d illustrates process-by-process sectional views for explaining a method for manufacturing a semiconductor device in accordance with a preferred embodiment of the present invention.

Figure 2A:
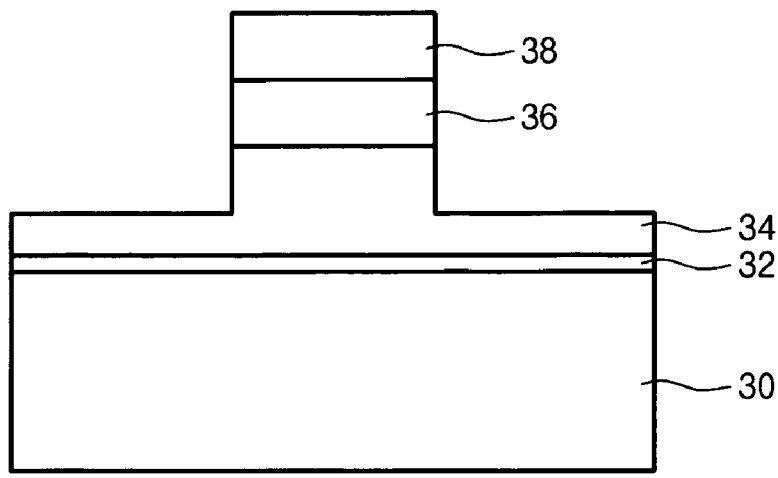
FIGS. 2a to 2d are process-by-process sectional views for explaining a method for manufacturing a semiconductor device in accordance with a preferred embodiment of the present invention.

Referring to FIG. 2a, a gate oxide film 32 is formed on a semiconductor substrate 30, and a first gate conductive layer 34, a second gate conductive layer 36 and a hard mask layer 38 are successively deposited on the gate oxide film 32. Here, the first and second gate conductive layers 34, 36 are formed in a polycide structure where a polycrystalline silicon layer and metal/metal silicide are laminated, and the hard mask layer 38 as an etching barrier is formed of a nitride film or the like.

Next, the second gate conductive layer 36 and the hard mask layer 38 are etched over their whole thicknesses, and the first gate conductive layer 34 is etched over its partial thickness, for example, 20 to 80% of its whole thickness while the remaining thickness of the first gate conductive layer is left unetched. In this way, a second gate conductive layer pattern 36 and a hard mask layer pattern 38 are formed and the first gate conductive layer 34 is formed in a concavo-convex shape.

Figure 2B:
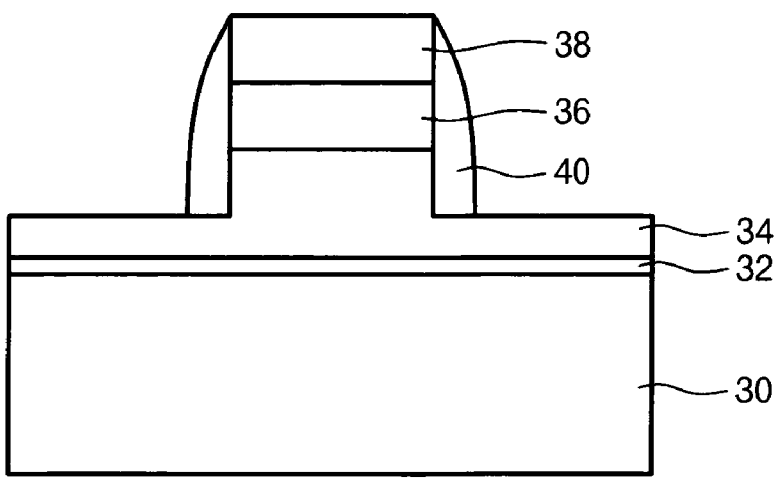

Referring to FIG. 2b, an insulating film for a first spacer, for example, an oxide film is coated over the entire surface of the resultant structure and is etched back to form a first spacer 40 on sidewalls of the first and second gate conductive layer patterns 34, 36 and the hard mask layer pattern 38. At this time, the first spacer 40 may consist of a low pressure tetra ethyl ortho silicate (LPTEOS) or a high temperature oxide (HTO) formed by a low pressure chemical vapor deposition (LPCVD) process, or an oxide film formed by an atomic layer deposition (ALD) process, and does not come in contact with the semiconductor substrate 30 because it is formed on the first gate conductive layer 34.

Figure 2C:
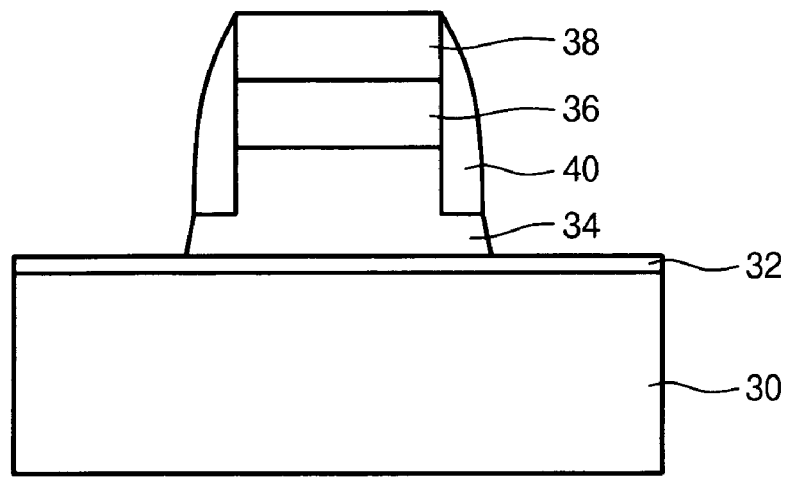

Referring to FIG. 2c, the remaining first gate conductive layer 34 exposed on both sides of the first spacer 40 is etched such that it inclines downwardly, through which a gate electrode consisting of the first and second gate conductive layer patterns 34, 36 is formed. At this time, the gate oxide film 32 is not etched.

Next, impurities for forming an LDD on the semiconductor substrate 30 are ion-implanted after the formation of the gate electrode. The ion implantation is performed with a dose amount of 1.0E12 to 5.0E14 (ions/cm$^2$) and an implantation energy of 5 to 50 keV when the impurity is p-type, with the same dose amount and an implantation energy of 10 to 100 keV when the impurity is As, and with the same dose amount and an implantation energy of 30 to 200 keV when the impurity is Sb. Also, a single wafer type apparatus or a batch type apparatus is used as an ion implantation apparatus, and an ion implantation angle is set to 0°, but inclined ion implantation up to at an ion implantation angle of 1 to 9° may be performed if necessary. In the inclined ion implantation, a batch type apparatus employing an inclination scheme of α, β may perform the inclined ion implantation at ion implantation angle of 0 to 5°, and a single wafer type apparatus may perform rotation twice or four times during the inclined ion implantation.

Figure 2D:
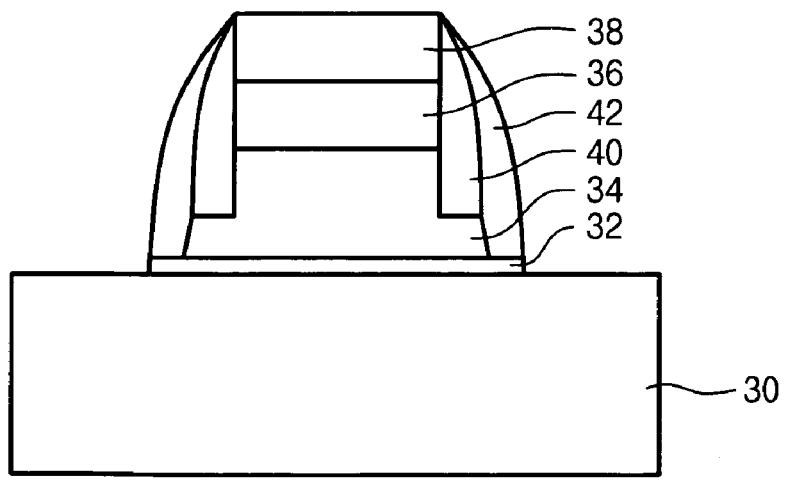

Referring to FIG. 2d, an insulating film for a second spacer, for example, a nitride film is coated over the entire surface of the above-mentioned structure and is etched back to form a second spacer 42 encompassing the first spacer 40 on sidewalls of the gate electrode and the hard mask layer pattern 38.

Figure 3:
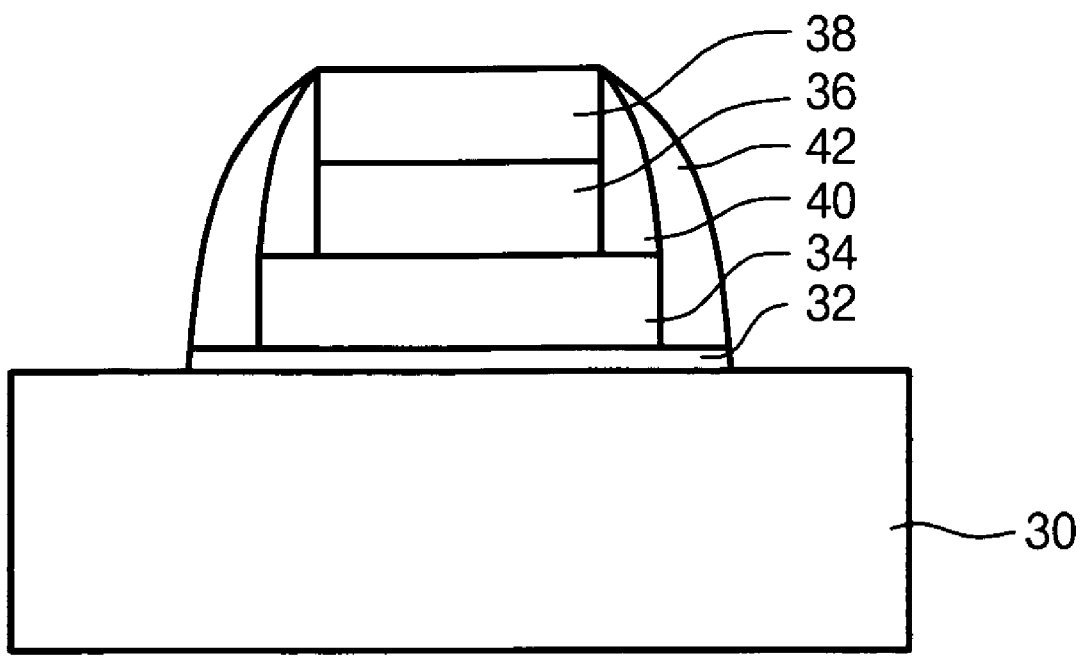
FIG. 3 is a sectional view of a semiconductor device produced by a method for manufacturing a semiconductor device in accordance with another preferred embodiment of the present invention.

FIG. 3 illustrates a sectional view of a semiconductor device produced by a method for manufacturing a semiconductor device in accordance with another preferred embodiment of the present invention. In the manufacturing method according to this embodiment, the same processes as those shown in FIGS. 2a to 2d progress, but the first spacer 40 is formed in a state where the first gate conductive layer 34 is not etched at all, and the second spacer 42 is formed after the first gate conductive layer 34 is etched.

As described above, in a method for manufacturing a semiconductor device, in particular, forming a MOSFET to which a double conductive layer gate electrode and a double spacer are applied, according to the present invention, since a first spacer of an oxide film is formed after only an upper gate conductive layer is primarily patterned, and then a second spacer of a nitride film is formed after a lower gate conductive layer is etched, the first spacer of the oxide film does not come in contact with a semiconductor substrate and thus impurities cannot be diffused up to into the semiconductor substrate through PLDs existing within the oxide film. Consequently, the gate hump phenomenon is prevented, as a result of which process yield and operation reliability of the device can be improved.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for manufacturing a semiconductor device, the method comprising the steps of:
   forming a gate oxide film on a semiconductor substrate;
   successively depositing a first gate conductive layer, a second gate conductive layer and a hard mask layer on the gate oxide film;
   etching the second gate conductive layer and the hard mask layer over the whole thicknesses thereof and etching the first gate conductive layer over a partial thickness thereof to form first and second gate conducive layer patterns and a hard mask layer pattern, wherein a portion of the unetched first gate conductive layer is exposed;

forming a first spacer of an oxide film on sidewalls of the etched first gate conductive layer, the second gate conductive layer patterns and the hard mask layer pattern, wherein a portion of the unetched first gate conductive layer is covered by the first spacer;

etching a remaining portion of the first gate conductive layer not covered by the first spacer, such that a gate electrode consisting of the first and second gate conductive layer patterns is formed, wherein the remaining portion inclines downwardly; and forming a second spacer of a nitride film on sidewalls of the first spacer and the first gate conductive layer pattern.

2. The method as claimed in claim 1, wherein when etching the first gate conductive layer over a partial thickness thereof, 20 to 80 % of a thickness of the first gate conductive layer is etched.

3. The method as claimed in claim 1, wherein the first spacer is formed of any one selected from the group consisting of a low pressure tetra ethyl ortho silicate (LPTEOS) or a high temperature oxide (HTO) provided by a low pressure chemical vapor deposition (LPCVD) process and an oxide film provided by an atomic layer deposition (ALD) process.

4. The method as claimed in claim 1, wherein LDD ion implantation is performed after the formation of the gate electrode and before the formation of the second spacer.

* * * * *